United States Patent
Wu et al.

(10) Patent No.: US 12,108,574 B2
(45) Date of Patent: Oct. 1, 2024

(54) TWO-PHASE IMMERSION-TYPE HEAT DISSIPATION STRUCTURE HAVING FINS FOR FACILITATING BUBBLE GENERATION

(71) Applicant: AMULAIRE THERMAL TECHNOLOGY, INC., New Taipei (TW)

(72) Inventors: Chun-Te Wu, New Taipei (TW);
Ching-Ming Yang, New Taipei (TW);
Yu-Wei Chiu, New Taipei (TW);
Tze-Yang Yeh, New Taipei (TW)

(73) Assignee: AMULAIRE THERMAL TECHNOLOGY, INC., New Taipei (TW)

( * ) Notice: Subject to any disclaimer, the term of this patent is extended or adjusted under 35 U.S.C. 154(b) by 219 days.

(21) Appl. No.: 17/981,466

(22) Filed: Nov. 6, 2022

(65) Prior Publication Data

US 2024/0155809 A1 May 9, 2024

(51) Int. Cl.
*F28D 15/00* (2006.01)
*H05K 7/20* (2006.01)

(52) U.S. Cl.
CPC ........... *H05K 7/2039* (2013.01); *H05K 7/203* (2013.01)

(58) Field of Classification Search
CPC .............................. H05K 7/2039; H05K 7/203

USPC ................................................... 165/104.21
See application file for complete search history.

(56) References Cited

FOREIGN PATENT DOCUMENTS

| CN | 209416149 U | * | 9/2019 |
| CN | 110631301 A | * | 12/2019 |
| CN | 114322618 A | * | 4/2022 |
| JP | H09159389 A | * | 6/1997 |

* cited by examiner

*Primary Examiner* — Davis D Hwu
(74) *Attorney, Agent, or Firm* — Li & Cai Intellectual Property Office

(57) ABSTRACT

A two-phase immersion-type heat dissipation structure having fins for facilitating bubble generation is provided. The two-phase immersion-type heat dissipation structure includes a heat dissipation substrate, and a plurality of fins. The heat dissipation substrate has a fin surface and a non-fin surface that face away from each other, the non-fin surface is configured to be in contact with a heat source immersed in a two-phase coolant, and the fin surface is connected with the plurality of fins. More than half of the fins are functional fins, and at least one side surface of each of the functional fins and the fin surface have an included angle therebetween that is from 80 degrees to 100 degrees. A center line average roughness (Ra) of the side surface is less than 3 μm, and a ten-point average roughness (Rz) of the side surface is not less than 12 μm.

7 Claims, 3 Drawing Sheets

TWO-PHASE IMMERSION-TYPE HEAT DISSIPATION STRUCTURE HAVING FINS FOR FACILITATING BUBBLE GENERATION

FIELD OF THE DISCLOSURE

The present disclosure relates to a heat dissipation structure, and more particularly to a two-phase immersion-type heat dissipation structure having fins for facilitating bubble generation.

BACKGROUND OF THE DISCLOSURE

An immersion cooling technology is to directly immerse heat producing elements (such as servers and disk arrays) into a coolant that is non-conductive, and heat generated from operation of the heat producing elements is removed through an endothermic gasification process of the coolant. Therefore, how to dissipate heat more effectively through the immersion cooling technology has long been an issue to be addressed in the industry.

SUMMARY OF THE DISCLOSURE

In response to the above-referenced technical inadequacy, the present disclosure provides a two-phase immersion-type heat dissipation structure having fins for facilitating bubble generation.

In one aspect, the present disclosure provides a two-phase immersion-type heat dissipation structure. The two-phase immersion-type heat dissipation structure includes a heat dissipation substrate, and a plurality of fins. The heat dissipation substrate has a fin surface and a non-fin surface that face away from each other, the non-fin surface is configured to be in contact with a heat source immersed in a two-phase coolant, and the fin surface is connected with the plurality of fins. More than half of the plurality of fins are functional fins, and at least one side surface of each of the functional fins and the fin surface have an included angle therebetween that is from 80 degrees to 100 degrees. A center line average roughness (Ra) of the side surface is less than 3 μm, a ten-point average roughness (Rz) of the side surface is not less than 12 μm, such that the side surface is a smooth surface but has a plurality of deep holes formed thereon, so as to promote bubble generation and detachment of bubbles.

In certain embodiments, the Rz of the side surface is greater than six times the Ra of the side surface.

In certain embodiments, the functional fins are pin-fins or plate-fins.

In certain embodiments, the functional fins are made of copper, copper alloy, or aluminum alloy.

In certain embodiments, the side surface is formed by grinding or shot-peening.

In certain embodiments, the side surface is formed by chemical etching.

In certain embodiments, the side surface is formed by deposition.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
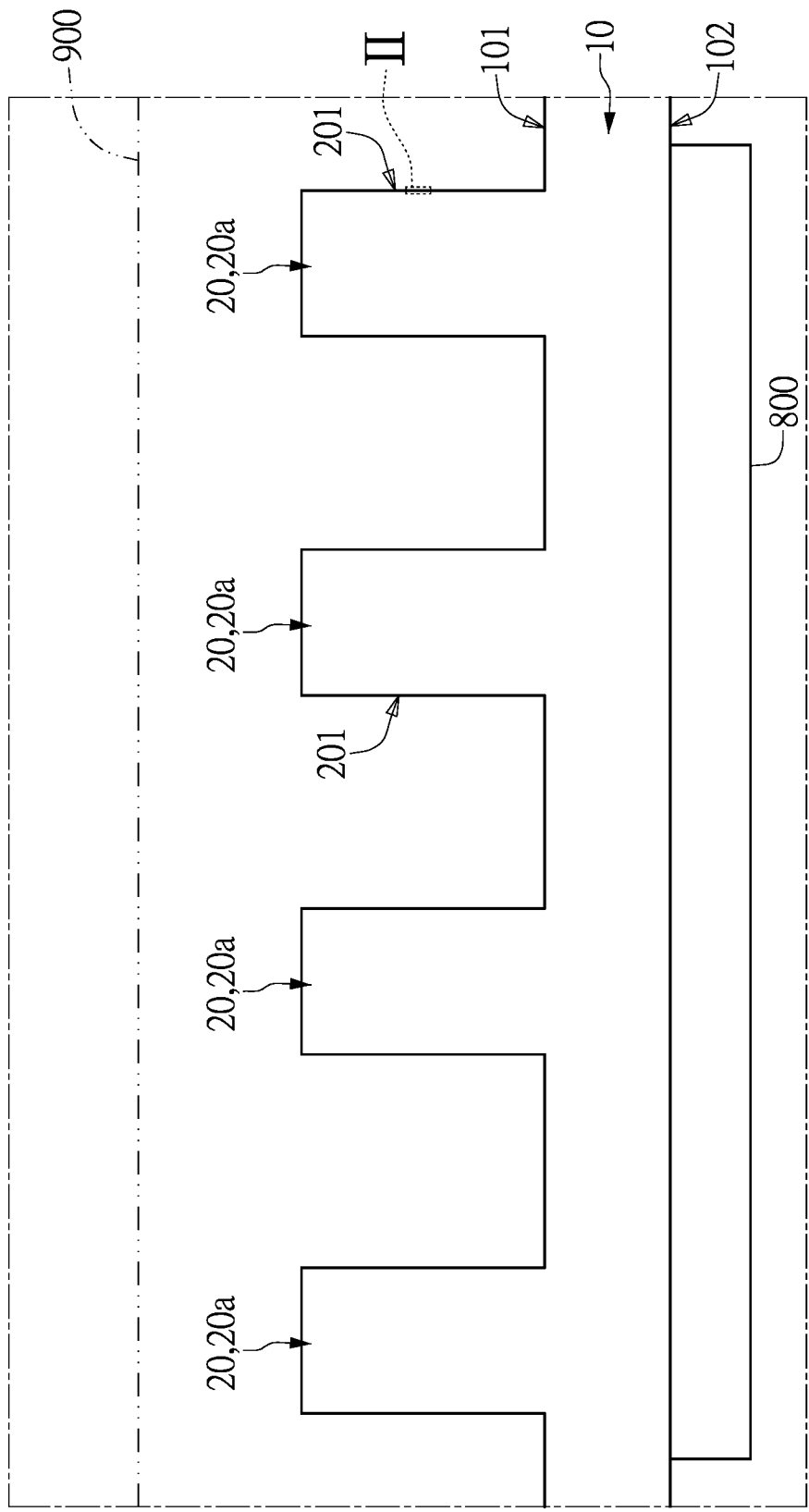
FIG. 1 is a schematic side view of a two-phase immersion-type heat dissipation structure according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
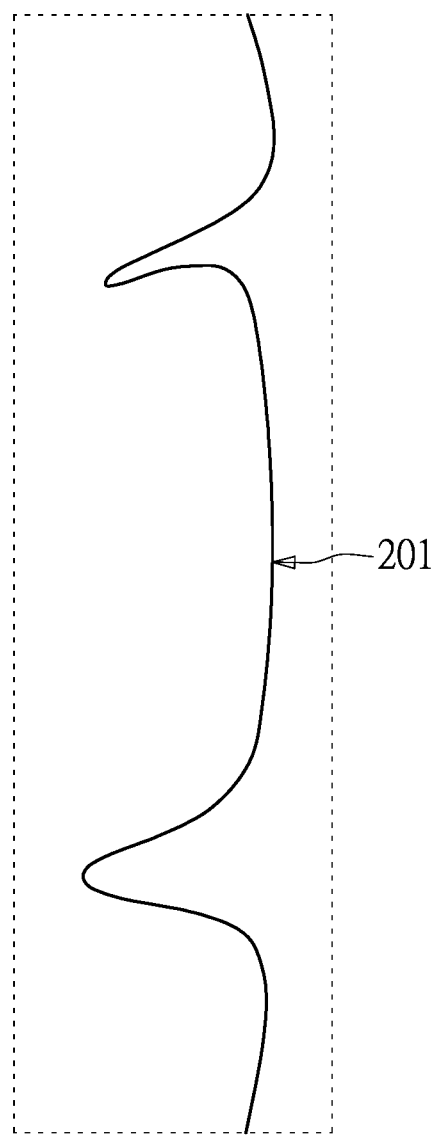
FIG. 2 is an enlarged view of part II of FIG. 1.

Referring to FIG. 1 to FIG. 2, a first embodiment of the present disclosure provides a two-phase immersion-type heat dissipation structure having fins for facilitating bubble generation for contacting a heat source immersed in a two-phase coolant. As shown in FIG. 1, the two-phase immersion-type heat dissipation structure having fins for facilitating bubble generation provided in the present disclosure includes a heat dissipation substrate 10 and a plurality of fins 20.

In this embodiment, the heat dissipation substrate 10 can be made of a material having high thermal conductivity, such as aluminum, copper, or copper alloy. The heat dissipation substrate 10 can be a non-porous heat dissipation plate or a porous heat dissipation plate. Preferably, the heat dissipation substrate 10 can be a porous heat dissipation plate immersed in a two-phase coolant 900 (FLUORINERT™) and having a porosity of greater than 8% such that an amount of bubbles generated is greatly increased so as to improve a heat-dissipation effect.

In this embodiment, the heat dissipation substrate 10 has a fin surface 101 and a non-fin surface 102 that face away from each other. The non-fin surface 102 of the heat dissipation substrate 10 is configured to be in contact (e.g., in a direct contact, or in an indirect contact via an intermediate layer) with a heat source 800 immersed in the two-phase coolant 900. The fin surface 101 of the heat dissipation substrate 10 is connected with the plurality of fins 20, and the heat dissipation substrate 10 and the fins 20 can be integrally connected with each other by metal injection molding or skiving. The heat dissipation substrate 10 and the fins 20 can also be connected by soldering. Moreover, the fins 20 can be pin-fins or plate-fins, and can be made of copper, copper alloy, or aluminum alloy.

In this embodiment, at least more than half of the plurality of fins 20 are functional fins 20a that can be located above the heat source 800 or correspond in position to the heat source 800. Furthermore, at least one side surface 201 of each of the functional fins 20a and the fin surface 101 have an included angle therebetween that is from 80 degrees to 100 degrees, that is, the side surface 201 is substantially perpendicular to the fin surface 101. In addition, because an immersion-type heat dissipation effect depends on a speed and an amount of bubble generation, a center line average roughness (Ra) of the side surface 201 of each of the functional fins 20a needs to be less than 3 μm, a ten-point average roughness (Rz) of the side surface 201 needs to be not less than 12 μm, such that the side surface 201 of each of the functional fins 20a is a smooth surface and has a plurality of deep holes formed thereon (as shown in FIG. 2), so as to promote bubble generation via the plurality of deep holes and detachment of bubbles after bubble generation via the smooth surface so as to improve the immersion-type heat dissipation effect.

Furthermore, in this embodiment, the Rz of the side surface 201 of each of the functional fins 20a needs to be greater than six times the Ra of the side surface 201 so that the immersion-type heat dissipation effect can be further improved.

In this embodiment, the side surface 201 of each of the functional fins 20a can be formed by grinding or shot-peening, that is, hard sand grains can be used to impact the functional fins 20a at high speed, such that the side surface 201 of the present disclosure can be formed on each of the functional fins 20a.

In this embodiment, the side surface 201 of each of the functional fins 20a can be formed by chemical etching. In detail, the side surface 201 of each of the functional fins 20a can be formed by performing a chemical etching using a chemical solution such as a phosphoric microetching solution, a sulfuric microetching solution, or a ferric chloride etching solution.

In this embodiment, the side surface 201 of each of the functional fins 20a can be formed by deposition. In detail, the side surface 201 of each of the functional fins 20a can be formed by liquid phase deposition or vapor phase deposition, such as physical vapor deposition or chemical vapor deposition.

Second Embodiment

Figure 3:
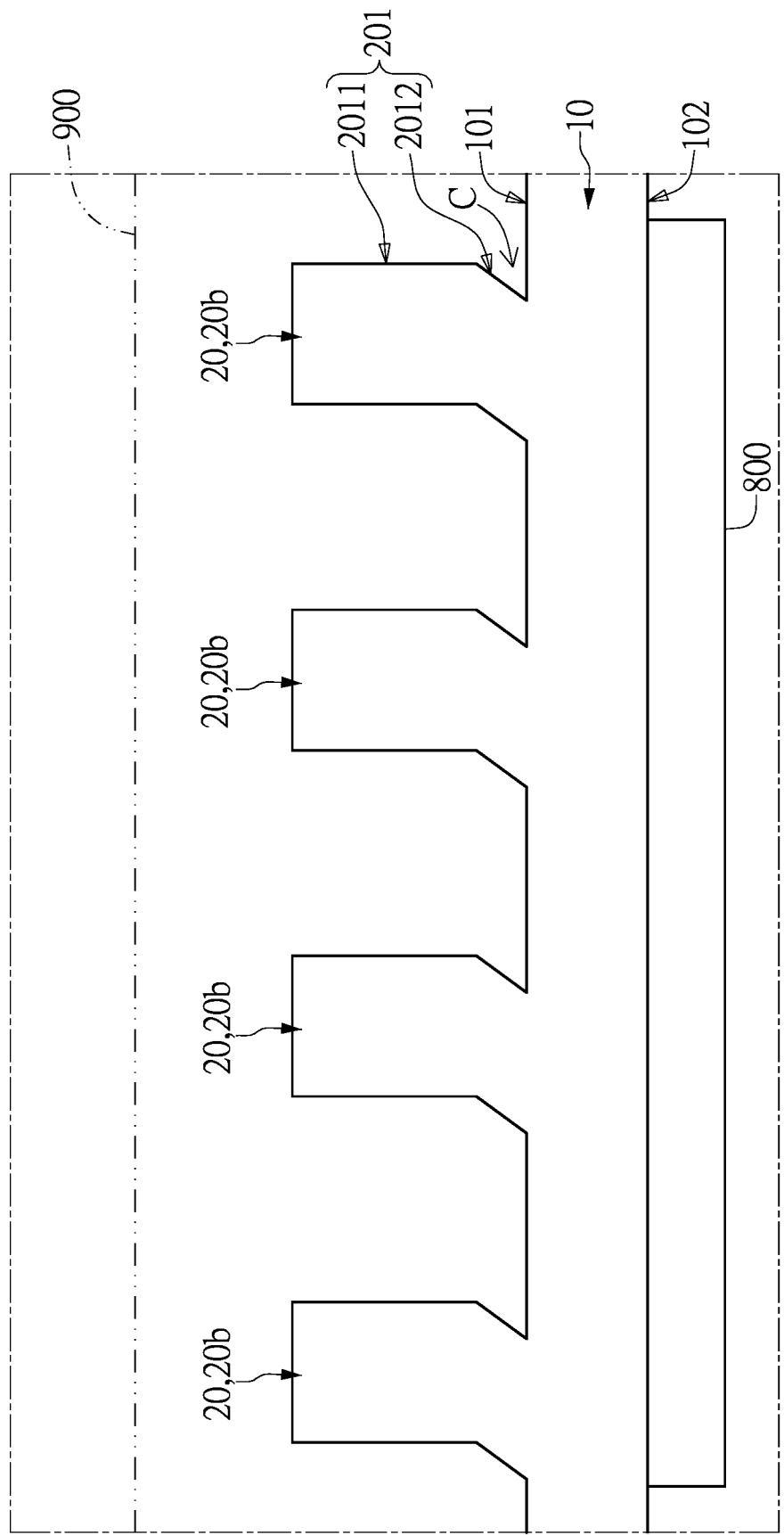
FIG. 3 is a schematic side view of a two-phase immersion-type heat dissipation structure according to a second embodiment of the present disclosure.

Referring to FIG. 3, a second embodiment of the present disclosure is substantially the same as the first embodiment, and the difference therebetween is described as follows.

In this embodiment, the side surface 201 of each of the functional fins 20b has a first surface 2011 and a second surface 2012 defined thereon that are connected to each other. An angle between the first surface 2011 and the fin surface 101 is from 80 degrees to 100 degrees, and an angle between the second surface 2012 and the fin surface 101 is less than 75 degrees, so that an acute-angle notched structure C is formed at a junction between the second surface 2012 and the fin surface 101. Therefore, in this embodiment, the acute-angle notched structure C is formed jointly by the second surface 2012 of the side surface 201 of each of the functional fins 20b and the fin surface 101, such that a thermal conduction path of the heat source 800 is limited, and a regional high temperature occurs at a tip of the acute-angle notched structure C. Therefore, in this embodiment, the regional high temperature promotes generation of the bubbles, and a contact area of the fins 20 and the two-phase coolant 900 being increased by the acute-angle notched structure C also promotes bubble generation.

Beneficial Effects of the Embodiments

In conclusion, in the two-phase immersion-type heat dissipation structure having fins for facilitating bubble generation, by technical features of "the two-phase immersion-type heat dissipation structure including a heat dissipation substrate, and a plurality of fins," "the heat dissipation substrate having a fin surface and a non-fin surface that face away from each other, the non-fin surface being configured to be in contact with a heat source immersed in a two-phase coolant, and the fin surface being connected with the plurality of fins," "more than half of the plurality of fins being functional fins," and "an angle between at least one side surface of each of the functional fins and the fin surface being from 80 degrees to 100 degrees, a center line average roughness (Ra) of the side surface being less than 3 μm, and a ten-point average roughness (Rz) of the side surface being not less than 12 μm," the side surface of each of the functional fins is a smooth surface but has a plurality of deep holes formed thereon, so as to promote bubble generation via the plurality of deep holes and detachment of bubbles after bubble generation via the smooth surface so as to improve the immersion-type heat dissipation effect.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A two-phase immersion-type heat dissipation structure, comprising:
    a heat dissipation substrate having a fin surface and a non-fin surface that face away from each other, wherein the non-fin surface is configured to be in contact with a heat source immersed in a two-phase coolant; and
    a plurality of fins, wherein the fin surface is connected with the plurality of fins;
    wherein more than half of the plurality of fins are functional fins, and at least one side surface of each of the functional fins and the fin surface have an included angle therebetween that is from 80 degrees to 100 degrees, and wherein a center line average roughness (Ra) of the side surface is less than 3 μm, a ten-point average roughness (Rz) of the side surface is not less than 12 μm, such that the side surface is a smooth surface and has a plurality of deep holes formed thereon, so as to promote bubble generation and detachment of bubbles.

2. The two-phase immersion-type heat dissipation structure according to claim 1, wherein the Rz of the side surface is greater than six times the Ra of the side surface.

3. The two-phase immersion-type heat dissipation structure according to claim 1, wherein the functional fins are pin-fins or plate-fins.

4. The two-phase immersion-type heat dissipation structure according to claim 1, wherein the functional fins are made of copper, copper alloy, or aluminum alloy.

5. The two-phase immersion-type heat dissipation structure according to claim 1, wherein the side surface is formed by grinding or shot-peening.

6. The two-phase immersion-type heat dissipation structure according to claim 1, wherein the side surface is formed by chemical etching.

7. The two-phase immersion-type heat dissipation structure according to claim 1, wherein the side surface is formed by deposition.

\* \* \* \* \*